United States Patent
Lin et al.

(10) Patent No.: US 12,142,340 B2
(45) Date of Patent: Nov. 12, 2024

(54) TESTING SYSTEM AND TESTING METHOD

(71) Applicant: Realtek Semiconductor Corporation, Hsinchu (TW)

(72) Inventors: Shih-Chieh Lin, Hsinchu (TW); Sheng-Lin Lin, Hsinchu (TW); Li-Wei Deng, Hsinchu (TW)

(73) Assignee: Realtek Semiconductor Corporation, Hsinchu (TW)

( * ) Notice: Subject to any disclaimer, the term of this patent is extended or adjusted under 35 U.S.C. 154(b) by 109 days.

(21) Appl. No.: 17/814,232

(22) Filed: Jul. 22, 2022

(65) Prior Publication Data
US 2023/0230652 A1 Jul. 20, 2023

(30) Foreign Application Priority Data

Jan. 14, 2022 (TW) .................................. 111101719

(51) Int. Cl.
G11C 29/56 (2006.01)
G11C 29/18 (2006.01)

(52) U.S. Cl.
CPC ........ G11C 29/56004 (2013.01); G11C 29/18 (2013.01); G11C 29/56012 (2013.01)

(58) Field of Classification Search
CPC .................................................... G11C 29/18
See application file for complete search history.

(56) References Cited

U.S. PATENT DOCUMENTS

| 6,108,252 A * | 8/2000 | Park ....................... G11C 29/50 714/719 |
| 8,918,690 B2 | 12/2014 | Hanagandi et al. |
| 2003/0212925 A1 * | 11/2003 | Ogura ................... G11C 11/406 714/42 |
| 2005/0080581 A1 * | 4/2005 | Zimmerman .......... G11C 29/02 702/117 |
| 2005/0188287 A1 * | 8/2005 | Combs ............. G01R 31/31711 714/718 |
| 2007/0115960 A1 * | 5/2007 | Yin ....................... H04L 1/0045 370/389 |
| 2008/0002511 A1 * | 1/2008 | Mou ........................ G11C 8/10 365/230.06 |
| 2008/0030218 A1 * | 2/2008 | Kang ............... G01R 31/31932 324/756.07 |
| 2008/0040640 A1 * | 2/2008 | Okabayashi ........... G11C 29/26 714/744 |
| 2010/0218057 A1 | 8/2010 | Maki et al. |
| 2014/0192583 A1 * | 7/2014 | Rajan ....................... G11C 7/10 365/63 |

OTHER PUBLICATIONS

L. Martirosyan, G. Harutyunyan, S. Shoukourian and Y. Zorian, "A power based memory BIST grouping methodology," 2015 IEEE East-West Design & Test Symposium (EWDTS), 2015, pp. 1-4, doi: 10.1109/EWDTS.2015.7493148.

* cited by examiner

*Primary Examiner* — Douglas King
(74) *Attorney, Agent, or Firm* — CKC & Partners Co., LLC

(57) ABSTRACT

A testing system includes a plurality of memory circuits and a testing circuit. The testing circuit is coupled to the memory circuits. The testing circuit is configured to perform a read/write operation on the memory circuits, and each of the memory circuits has a read/write starting time point corresponding to the read/write operation. The testing circuit is further configured to control the read/write starting time points of the memory circuits to be different from each other.

18 Claims, 4 Drawing Sheets

TESTING SYSTEM AND TESTING METHOD

RELATED APPLICATIONS

This application claims priority to Taiwanese Application Serial Number 111101719, filed Jan. 14, 2022, which is herein incorporated by reference.

BACKGROUND

Technical Field

The present disclosure relates to testing technology. More particularly, the present disclosure relates to a testing system and a testing method for testing memory circuits.

Description of Related Art

With developments of technology, there are more and more memories in an electronic device. However, based on the manufacturing process or other factors, the memories may have defects. In some related arts, a testing circuit can be used to test the memories to determine whether the memories have defects.

SUMMARY

Some aspects of the present disclosure are to provide a testing system. The testing system includes a plurality of memory circuits and a testing circuit. The testing circuit is coupled to the memory circuits. The testing circuit is configured to perform a read/write operation on the memory circuits, and each of the memory circuits has a read/write starting time point corresponding to the read/write operation. The testing circuit is further configured to control the read/write starting time points of the memory circuits to be different from each other.

Some aspects of the present disclosure are to provide a testing method. The testing method includes following operations: performing, by a testing circuit, a read/write operation on a plurality of memory circuits, in which each of the memory circuits has a read/write starting time point corresponding to the read/write operation; and controlling, by the testing circuit, the read/write starting time points of the memory circuits to be different from each other.

As described above, the present disclosure uses a single testing circuit to test the multiple memory circuits, and the testing circuit can stagger the read/write starting time points of the memory circuits. Accordingly, the present disclosure can avoid excessive instantaneous voltage drop without increasing (or significantly increasing) the circuit area and without increasing the testing time to ensure that the circuit works correctly.

BRIEF DESCRIPTION OF THE DRAWINGS

The disclosure can be more fully understood by reading the following detailed description of the embodiment, with reference made to the accompanying drawings as follows.

DETAILED DESCRIPTION

In the present disclosure, "connected" or "coupled" may refer to "electrically connected" or "electrically coupled." "Connected" or "coupled" may also refer to operations or actions between two or more elements.

Figure 1:
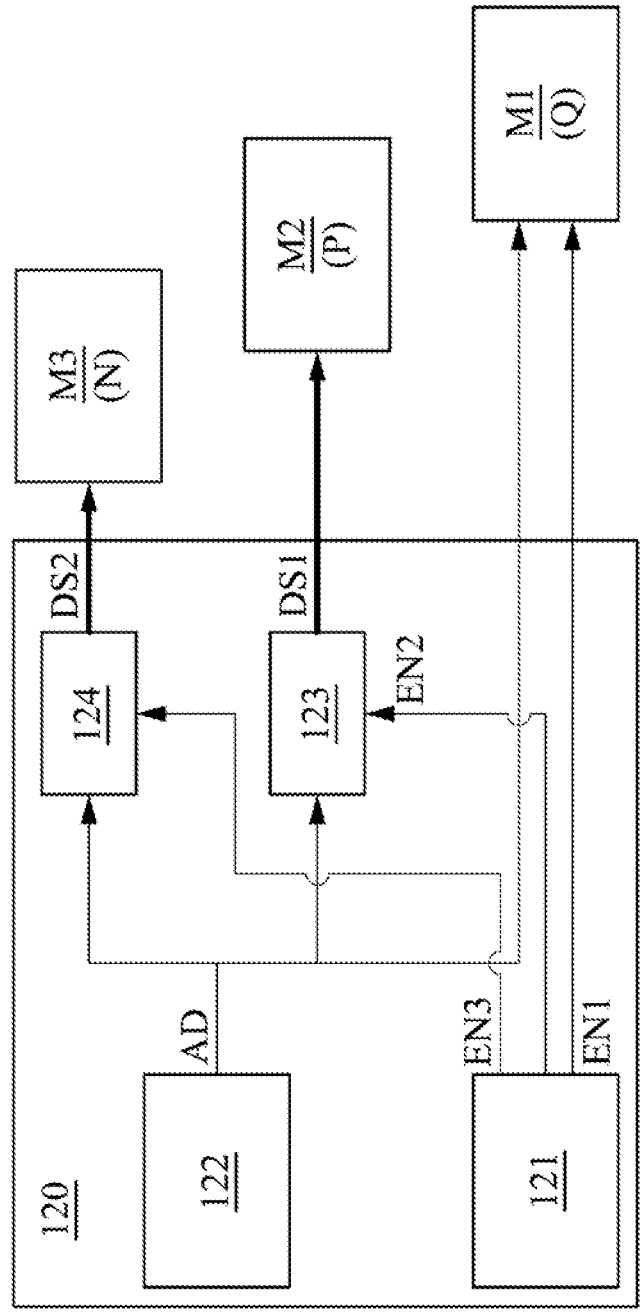
FIG. 1 is a schematic diagram of a testing system according to some embodiments of the present disclosure.

Reference is made to FIG. 1. FIG. 1 is a schematic diagram of a testing system 100 according to some embodiments of the present disclosure.

As illustrated in FIG. 1, the testing system 100 includes memory circuits M1-M3 and a testing circuit 120. The testing circuit 120 is coupled to the memory circuits M1-M3. In some embodiments, the testing circuit 120 is implemented by a memory built-in self test (MBIST) circuit, and the memory circuits M1-M3 are integrated on a single chip.

In some embodiments, storage capacities of the memory circuits M1-M3 are different from each other. In some other embodiments, the storage capacities of the memory circuits M1-M3 are not different from each other.

For better understanding, the storage capacities of the memory circuits M1-M3 are different from each other in the following example, but the present disclosure is not limited thereto. As illustrated in FIG. 1, the memory circuit M1 has Q entries, the memory circuit M2 has P entries, and the memory circuit M3 has N entries, in which Q, P, N are positive integers, Q is greater than P and P is greater than N. In other words, the storage capacity of the memory circuit M1 is greater than the storage capacity of the memory circuit M2, and the storage capacity of the memory circuit M2 is greater than the storage capacity of the memory circuit M3.

It is noted that the quantity of the memory circuits in FIG. 1 is merely for illustration and various suitable quantities are in the contemplated scopes of the present disclosure.

The testing circuit 120 can be understood as a memory access controller and is used to perform a read/write operation on the memory circuits M1-M3 to test them. For the same read/write operation, all entries in the memory circuits M1-M3 are read or written. In other words, for the same read/write operation, a total work time interval of the memory circuit M1 with the most entries (storage capacity is greatest) is the longest, and a total work time interval of the memory circuit M3 with the fewest entries is the shortest.

Figure 2:
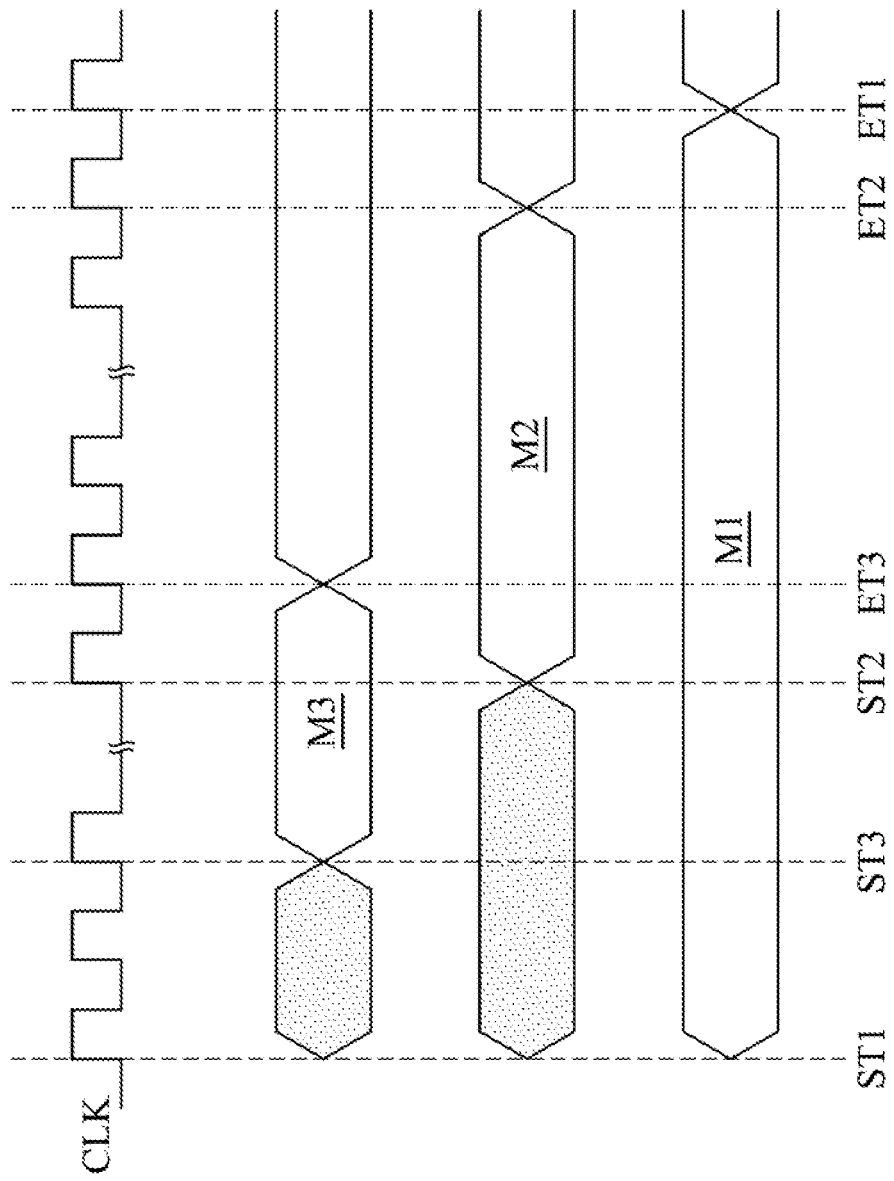
FIG. 2 is a diagram showing operation timeline of the testing system in FIG. 1 according to some embodiments of the present disclosure.

References are made to FIG. 1 and FIG. 2. FIG. 2 is a diagram showing operation timeline of the testing system 100 in FIG. 1 according to some embodiments of the present disclosure. The testing circuit 120 can control read/write starting time points ST1-ST3 of the memory circuits M1-M3 to be different from each other based on a clock signal CLK. As illustrated in FIG. 2, for the same read/write operation, the testing circuit 120 can perform the read/write operation on the memory circuit M1 at the read/write starting time point ST1 based on the clock signal CLK, perform the read/write operation on the memory circuit M2 at the read/write starting time point ST2 based on the clock signal CLK, and perform the read/write operation to be performed on the memory circuit M3 at the read/write starting time point ST3 based on the clock signal CLK.

As illustrated in FIG. 1, the testing circuit 120 includes an enabling signal generator circuit 121, an address generator circuit 122, an offset circuit 123 and an offset circuit 124.

The enabling signal generator circuit 121 is used to generate and output enabling signals EN1-EN3. The enabling signals EN1-EN3 are mainly used to enable or disable the memory circuits M1-M3. The address generator circuit 122 is used to generate and output an address signal AD. The address signal AD is mainly used to determine which entries in the memory circuits M1-M3 the read/write operation is performed on.

In FIG. 1, the enabling signal generator circuit 121 and the address generator circuit 122 are coupled to the memory circuit M1. The memory circuit M1 can receive the enabling signal EN1 from the enabling signal generator circuit 121 and the address signal AD from the address generator circuit 122. Accordingly, when the enabling signal EN1 has an enable level at the read/write starting time point ST1, the read/write operation can be performed on the memory circuit M1 according to the enabling signal EN1 and the address signal AD at the read/write starting time point ST1.

In addition, the enabling signal generator circuit 121 and the address generator circuit 122 are coupled to the offset circuit 123, and the offset circuit 123 is coupled to the memory circuit M2. The offset circuit 123 can receive the enabling signal EN2 from the enabling signal generator circuit 121 and the address signal AD from the address generator circuit 122. Then, the offset circuit 123 can generate an offset signal DS1 according to the enabling signal EN2 and the address signal AD. The read/write operation can be performed on the memory circuit M2 according to the offset signal DS1 at the read/write starting time point ST2.

In some embodiments, the offset circuit 123 can include a comparator. The comparator compares an address value carried in the address signal AD and a first offset value (e.g., 256). The address value carried in the address signal AD can count down from an initial address value (e.g., 0). When the current address value (e.g., 256) carried in the address signal AD is identical to a first shifting value (e.g., the starting time point ST2), the enabling signal EN2 has an enable level. Thus, the offset circuit 123 can generate the offset signal DS1 to enable the memory circuit M2 at the read/write starting time point ST2 and determine which entry (e.g., entry 0) in the memory circuit M2 is to be read or written according to a difference value between the current address value and the first shifting value (e.g., 256−256=0).

Similarly, the enabling signal generator circuit 121 and the address generator circuit 122 are coupled to the offset circuit 124, and the offset circuit 124 is coupled to the memory circuit M3. The offset circuit 124 can receive the enabling signal EN3 from the enabling signal generator circuit 121 and the address signal AD from the address generator circuit 122. Then, the offset circuit 124 can generate an offset signal DS2 according to the enabling signal EN3 and the address signal AD. The read/write operation can be performed on the memory circuit M3 according to the offset signal DS2 at the read/write starting time point ST3.

Similarly, in some embodiments, the offset circuit 124 can include a comparator. The comparator compares an address value carried in the address signal AD and a second offset value (e.g., 128). As described above, the address value carried in the address signal AD can count down from an initial address value (e.g., 0). When the current address value (e.g., 128) carried in the address signal AD is identical to a second shifting value (e.g., the starting time point ST3), the enabling signal EN3 has an enable level. Thus, the offset circuit 124 can generate the offset signal DS2 to enable the memory circuit M3 at the read/write starting time point ST3 and determine which entry (e.g., entry 0) in the memory circuit M3 is to be read or written according to a difference value between the current address value and the second shifting value (e.g., 128−128=0).

As illustrated in FIG. 2, the read/write starting time point ST1 is earlier than the read/write starting time point ST3, and the read/write starting time point ST3 is earlier than the read/write starting time point ST2. In other words, the read/write starting time point ST1 of the memory circuit M1 with the greatest storage capacity is the earliest. There is a first delay time interval (marked with dots) between the read/write starting time point ST3 and the read/write starting time point ST1, and there is a second delay time interval (marked with dots) between the read/write starting time point ST2 and the read/write starting time point ST1, and the second delay time interval is longer than the first delay time interval. It is noted that the read/write starting time point ST3 in FIG. 2 is earlier than the read/write starting time point ST2, but the present disclosure is not limited thereto. In some other embodiments, the read/write starting time point ST3 can be later than the read/write starting time point ST2.

The time interval (work time interval) between the read/write starting time point of a memory circuit and read/write ending time point of this memory circuit is positively related to the storage capacity of this memory circuit. As illustrated in FIG. 2, since the storage capacity of the memory circuit M1 is the greatest, the time interval between the read/write starting time point ST1 of the memory circuit M1 and a read/write ending time point ET1 of the memory circuit M1 is the longest. Since the storage capacity of the memory circuit M3 is the smallest, the time interval between the read/write starting time point ST3 of the memory circuit M3 and a read/write ending time point ET3 of the memory circuit M3 is the shortest.

In some embodiments, the testing circuit 120 can control a read/write ending time point ET2 of the memory circuit M2 and the read/write ending time point ET3 of the memory circuit M3 not later than (aligned with or earlier than) the read/write ending time point ET1 of the memory circuit M1 with the largest storage capacity. Accordingly, it can avoid extra testing time. In the example in FIG. 2, the testing circuit 120 controls the read/write ending time point ET1 of the memory circuit M1, the read/write ending time point ET2 of the memory circuit M2, and the read/write ending time point ET3 of the memory circuit M3 to be different from each other.

In some embodiments, a disable timing point of a memory circuit is the read/write ending time point of this memory circuit. As illustrated in FIG. 1 and FIG. 2, the enabling signal EN1 has a disable level at the read/write ending time point ET1 to disable the memory circuit M1. The enabling signal EN2 has a disable level at the read/write ending time point ET2 such that the offset signal DS1 can be used to disable the memory circuit M2. The enabling signal EN3 has a disable level at the read/write ending time point ET3 such that the offset signal DS2 can be used to disable the memory circuit M3. Accordingly, it can reduce power consumption.

In some other embodiments, the disable levels of all memory circuits M1-M3 are identical to the read/write ending time point of the memory circuit M1 with the greatest storage capacity. In other words, all of the enabling signals EN1-EN3 has the disable level at the read/write ending time point ET1 to disable the memory circuits M1-M3. The time interval between the read/write ending time point ET2 of the memory circuit M2 and the read/write ending time point ET1 of the memory circuit M1 is an idle time interval of the memory circuit M2, and the time interval between the read/write ending time point ET3 of the memory circuit M3 and the read/write ending time point ET1 of the memory circuit M1 is an idle time interval of the memory circuit M3.

In some related arts, in order to save the circuit area of the testing circuit, a single testing circuit is used to test multiple memory circuits. In these arts, when the testing process starts (from the idle state to the testing state), a large current is generated. The large current can cause insufficient power supply and result in an excessive instantaneous voltage drop and circuit failure.

In some related arts, in order to avoid excessive instantaneous voltage drop, multiple testing circuits are used to test the multiple memory circuits. However, this increases the area of the testing circuit and thus increases the overall chip size. In other related arts, in order to avoid excessive instantaneous voltage drop, the memory circuits are divided into multiple groups and the groups are tested by a time division mechanism. However, this increases testing time.

Compared to the aforementioned related arts, in the present disclosure, the single testing circuit 120 is used to test the memory circuits M1-M3, and the testing circuit 120 can stagger the read/write starting time points ST1-ST3 of the memory circuits M1-M3. Accordingly, the present disclosure can avoid excessive instantaneous voltage drop caused by the large current without increasing (or significantly increasing) the circuit area and without increasing the testing time to ensure that the circuit works correctly. When the work time intervals of the memory circuits M1-M3 overlap less, the effect of avoiding the large current is better.

Figure 3:
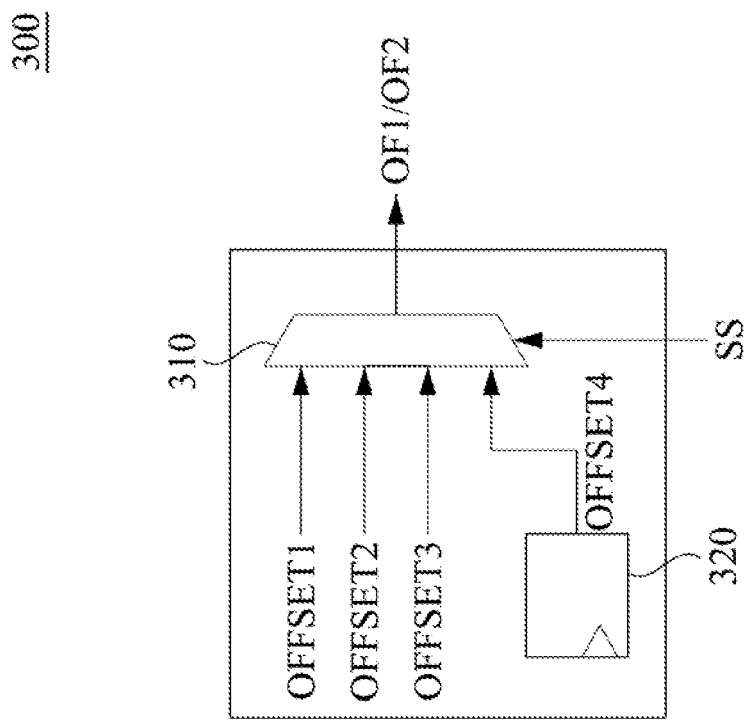
FIG. 3 is a schematic diagram of an offset value generator circuit according to some embodiments of the present disclosure.

Reference is made to FIG. 3. FIG. 3 is a schematic diagram of an offset value generator circuit 300 according to some embodiments of the present disclosure. In some embodiments, the offset circuit 123 or 124 in FIG. 1 further includes the offset value generator circuit 300, and the offset value generator circuit 300 is used to generate the aforementioned first offset value (referenced as OF1 in FIG. 3) or the aforementioned second offset value (referenced as OF2 in FIG. 3).

As illustrated in FIG. 3, the offset value generator circuit 300 includes a multiplexer 310 and a register 320. The multiplexer 310 includes multiple input terminals. One of the input terminals of the multiplexer 310 is coupled to the register 320, and other input terminals of the multiplexer 310 are used to receive a candidate offset value OFFSET1, a candidate offset value OFFSET2, and a candidate offset value OFFSET3 respectively. The register 320 can generate a candidate offset value OFFSET4 based on system requirements or application scenarios and according to a user operation or a command from a control circuit.

The multiplexer 310 can output one of the candidate offset value OFFSET1, the candidate offset value OFFSET2, the candidate offset value OFFSET3, and the candidate offset value OFFSET4 according to a selection signal SS to be the aforementioned first offset value OF1 or the aforementioned second offset value OF2. The selection signal SS can be generated based on system requirements or application scenarios and according to a user operation or a command from a control circuit. Then, as described above, the offset circuit 123 or 124 can generate the offset signal DS1 or DS2 according to the first offset value OF1 or the second offset value OF2.

Since the candidate offset value OFFSET4 or the selection signal SS can be adjusted based on the system requirements or the application scenarios, this architecture has greater flexibility and is applicable to more environments.

It is noted that the quantity of the candidate offset values or the register in FIG. 3 is merely for illustration and various suitable quantities are in the contemplated scopes of the present disclosure.

Figure 4:
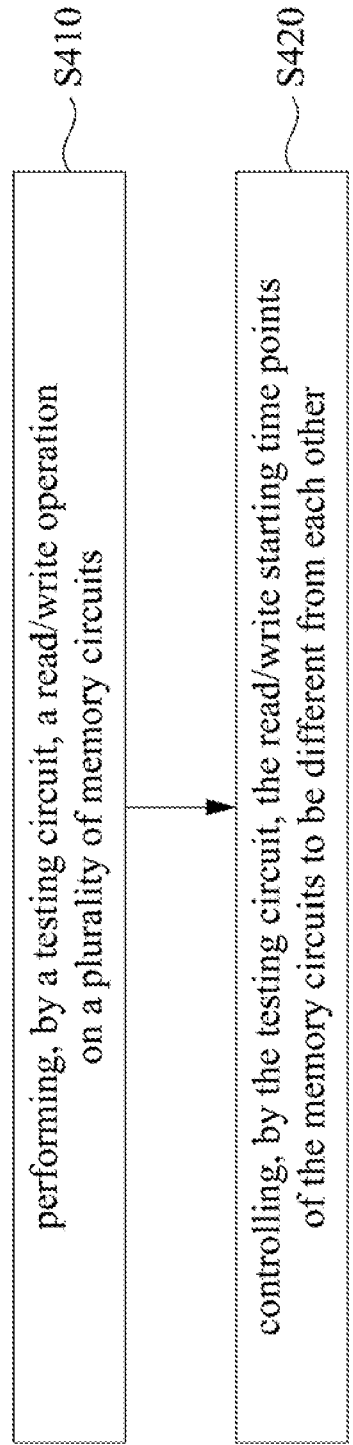
FIG. 4 is a flow diagram of a testing method according to some embodiments of the present disclosure.

Reference is made to FIG. 4. FIG. 4 is a flow diagram of a testing method 400 according to some embodiments of the present disclosure. As illustrated in FIG. 4, the testing method 400 includes operation S410 and operation S420.

In some embodiments, the testing method 400 can be implemented to the testing system 100 in FIG. 1, but the present disclosure is not limited thereto. However, for better understanding, the testing method 400 is described with the testing system 100 in FIG. 1.

In operation S410, the testing circuit 120 performs the read/write operation on the memory circuits M1-M3. Each of the memory circuits M1-M3 has one read/write starting time point corresponding to the read/write operation. As illustrated in FIG. 2, the memory circuit M1 corresponds to the read/write starting time point ST1, the memory circuit M2 corresponds to the read/write starting time point ST2, and the memory circuit M3 corresponds to the read/write starting time point ST3.

In operation S420, the testing circuit 120 controls the read/write starting time points ST1-ST3 of the memory circuits M1-M3 to be different from each other. In some embodiments, the read/write starting time point ST1 of the memory circuit M1 with the greatest storage capacity is earliest, and the read/write starting time points ST2-ST3 of the memory circuit M2-M3 are later than the read/write starting time point ST1.

As described above, the present disclosure uses a single testing circuit to test the multiple memory circuits, and the testing circuit can stagger the read/write starting time points of the memory circuits. Accordingly, the present disclosure can avoid excessive instantaneous voltage drop without increasing (or significantly increasing) the circuit area and without increasing the testing time to ensure that the circuit works correctly.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A testing system, comprising:
   a plurality of memory circuits; and
   a testing circuit coupled to the memory circuits, wherein the testing circuit is configured to perform a read/write operation on the memory circuits, and each of the memory circuits has a read/write starting time point corresponding to the read/write operation,
   wherein the testing circuit is further configured to control the read/write starting time points of the memory circuits to be different from each other,
   wherein the memory circuits have different total work time intervals,
   wherein the memory circuits comprise a first memory circuit and a second memory circuit, wherein a storage capacity of the first memory circuit is greater than a storage capacity of the second memory circuit, wherein the read/write starting time point of the first memory circuit is earlier than the read/write starting time point of the second memory circuit,
wherein each of the first memory circuit and the second memory circuit has a read/write ending time point corresponding to the read/write operation, and the read/write ending time point of the second memory circuit is aligned with or earlier than the read/write ending time point of the first memory circuit.

2. The testing system of claim 1, wherein a total work time interval of the first memory circuit is longer than a total work time interval of the second memory circuit.

3. The testing system of claim 2, wherein the testing circuit comprises:
an enabling signal generator circuit configured to generate a first enabling signal and a second enabling signal;
an address generator circuit configured to generate an address signal; and
a first offset circuit configured to generate a first offset signal according to the second enabling signal and the address signal,
wherein the read/write operation is performed on the first memory circuit according to the first enabling signal and the address signal,
wherein the read/write operation is performed on the second memory circuit according to the first offset signal.

4. The testing system of claim 3, wherein the first offset circuit is configured to compare an address value carried in the address signal and an offset value,
wherein when the address value is identical to the offset value, the first offset circuit generates the first offset signal according to the second enabling signal and the address signal to perform the read/write operation on the second memory circuit.

5. The testing system of claim 4, wherein the first offset circuit comprises:
a multiplexer configured to receive a plurality of candidate offset values, and select the offset value from the candidate offset values according to a selection signal.

6. The testing system of claim 5, wherein the first offset circuit further comprises:
a register coupled to the multiplexer, wherein the register is configured to generate one of the candidate offset values.

7. The testing system of claim 3, wherein the second enabling signal has a disable level at the read/write ending time point of the second memory circuit.

8. The testing system of claim 3, wherein the second enabling signal has a disable level at the read/write ending time point of the first memory circuit.

9. The testing system of claim 3, wherein the memory circuits further comprise a third memory circuit, wherein the enabling signal generator circuit is further configured to generate a third enabling signal, wherein the testing circuit comprises:
a second offset circuit configured to generate a second offset signal according to the third enabling signal and the address signal,
wherein the read/write operation is performed on the third memory circuit according to the second offset signal.

10. A testing method, comprising:
performing, by a testing circuit, a read/write operation on a plurality of memory circuits, wherein each of the memory circuits has a read/write starting time point corresponding to the read/write operation; and
controlling, by the testing circuit, the read/write starting time points of the memory circuits to be different from each other,
wherein the memory circuits have different total work time intervals,
wherein the memory circuits comprise a first memory circuit and a second memory circuit, wherein a storage capacity of the first memory circuit is greater than a storage capacity of the second memory circuit,
wherein the testing method further comprises:
controlling, by the testing circuit, the read/write starting time point of the first memory circuit to be earlier than the read/write starting time point of the second memory circuit; and
controlling, by the testing circuit, a read/write ending time point of the second memory circuit to be aligned with or earlier than a read/write ending time point of the first memory circuit.

11. The testing method of claim 10, wherein a total work time interval of the first memory circuit is longer than a total work time interval of the second memory circuit.

12. The testing method of claim 11, further comprising:
generating, by an enabling signal generator circuit in the testing circuit, a first enabling signal and a second enabling signal;
generating, by an address generator circuit in the testing circuit, an address signal; and
generating, by a first offset circuit in the testing circuit, a first offset signal according to the second enabling signal and the address signal,
wherein the read/write operation is performed on the first memory circuit according to the first enabling signal and the address signal,
wherein the read/write operation is performed on the second memory circuit according to the first offset signal.

13. The testing method of claim 12, further comprising:
comparing, by the first offset circuit, an address value carried in the address signal and an offset value; and
generating, by the first offset circuit, the first offset signal according to the second enabling signal and the address signal to perform the read/write operation on the second memory circuit when the address value is identical to the offset value.

14. The testing method of claim 13, further comprising:
receiving, by a multiplexer in the first offset circuit, a plurality of candidate offset values; and
selecting, by the multiplexer, the offset value from the candidate offset values according to a selection signal.

15. The testing method of claim 14, further comprising:
generating, by a register in the first offset circuit, one of the candidate offset values.

16. The testing method of claim 12, wherein the second enabling signal has a disable level at the read/write ending time point of the second memory circuit.

17. The testing method of claim 12, wherein the second enabling signal has a disable level at the read/write ending time point of the first memory circuit.

18. The testing method of claim 12, wherein the memory circuits further comprise a third memory circuit and the testing circuit further comprises:
generating, by the enabling signal generator circuit, a third enabling signal; and
generating, by a second offset circuit in the testing circuit, a second offset signal according to the third enabling signal and the address signal, wherein the read/write operation is performed on the third memory circuit according to the second offset signal.

* * * * *